United States Patent
Alcoe et al.

(10) Patent No.: US 7,088,008 B2
(45) Date of Patent: Aug. 8, 2006

(54) ELECTRONIC PACKAGE WITH OPTIMIZED CIRCUITIZATION PATTERN

(75) Inventors: David J. Alcoe, Vestal, NY (US); William Infantolino, Vestal, NY (US); Virendra R. Jadhav, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/392,617

(22) Filed: Mar. 20, 2003

(65) Prior Publication Data
US 2004/0183211 A1    Sep. 23, 2004

(51) Int. Cl.
H01L 23/48 (2006.01)
H01L 23/52 (2006.01)
H01L 29/40 (2006.01)

(52) U.S. Cl. .......... 257/786; 257/773; 257/737; 257/739; 257/780; 257/702; 257/778

(58) Field of Classification Search .......... 257/773, 257/786, 774, 737, 778, 738, 780, 702; 174/73.1, 174/263; 361/777
See application file for complete search history.

(56) References Cited

U.S. PATENT DOCUMENTS

| | | | |
|---|---|---|---|
| 4,927,983 A | 5/1990 | Jones et al. | 174/258 |
| 5,097,593 A | 3/1992 | Jones et al. | 29/852 |
| 5,764,485 A | 6/1998 | Lebaschi | 361/774 |
| 5,875,102 A | 2/1999 | Barrow | 361/777 |
| 5,891,606 A | 4/1999 | Brown | 430/312 |
| 5,994,781 A * | 11/1999 | Smith | 257/773 |
| 6,046,909 A * | 4/2000 | Joy | 361/748 |
| 6,091,155 A | 7/2000 | Jonaidi | 257/786 |
| 6,342,682 B1 | 1/2002 | Mori et al. | 174/262 |
| 6,552,425 B1 * | 4/2003 | Yan et al. | 257/690 |

* cited by examiner

*Primary Examiner*—Nitin Parekh
(74) *Attorney, Agent, or Firm*—George R. McGuire; Bond, Schoeneck & King, PLLC

(57) ABSTRACT

An electronic package, such as a chip carrier, with an optimized circuit pattern having a circuitized substrate with a first and second circuit pattern is provided. The circuitized substrate includes a corner surface region. The second circuit pattern is electrically connected to the first circuit pattern on the corner surface region of the circuitized substrate and is positioned in such a manner so as to substantially inhibit cracking of the first circuit pattern during flexure of the chip carrier.

25 Claims, 3 Drawing Sheets

US 7,088,008 B2

ELECTRONIC PACKAGE WITH OPTIMIZED CIRCUITIZATION PATTERN

FIELD OF THE INVENTION

The present invention relates, in general to a flexible chip carrier for interconnecting a semiconductor chip to a printed circuit board, and in particular, to a circuitized substrate for use in such a carrier.

BACKGROUND OF THE INVENTION

Circuitized substrates, such as chip carriers, have been and continue to be developed for many applications. A circuitized substrate, such as an organic chip carrier for interconnecting a semiconductor chip to a printed circuit board in an electronic package, may have a surface redistribution layer for redistributing electrical signals from the circuitized substrate into a larger area so that the circuitized substrate can properly interface with the printed circuit board. A solder mask may be positioned on the redistribution layer.

As semiconductor chip input/output (I/O) count increases beyond the capability of peripheral lead devices and as the need for both semiconductor chip and printed circuit board miniaturization increases, area array interconnects will be the preferred method for making large number of connections between a chip carrier and a printed circuit board. For circuitized organic substrates, including chip carriers and printed circuit boards, it is known that the materials making up these substrates have some flexibility. All flexible materials have some limitations on the amount of mechanical strain which can be tolerated until the material fractures and fails. A measure of this is commonly known as ductility. During manufacture of an electronic package and its assembly to a printed circuit board, many sources of chip carrier and printed circuit board flexure or bending exist. Sources include manual handling through assembly, placing the printed circuit board into tooling fixtures, assembling other components onto the printed circuit board, assembly of cables and hardware to the printed circuit board and use of pressure-probes for electrical testing. Furthermore, if the coefficient of thermal expansion (CTE) of the semiconductor chip, the chip carrier, and the printed circuit board are substantially different from one another, temperature changes during operation of the electronic package can cause flexure or bending of the organic structures by different amounts. As a result, industry standard ball grid array (BGA) interconnections between the chip carrier and printed circuit board may be subject to high stress. These high stresses can be transmitted into the chip carrier and can potentially cause high strain on the chip carrier materials beyond the limits of their ductility, and cause damage in the chip carrier. Significant yield loss concerns during manufacturing, and reliability concerns during thermal cycling field operation may become manifest by failure (cracking or delamination) of dielectrics and circuitry on or within the chip carrier or even failure of the integrity of the semiconductor chip (chip cracking) caused by high stress during manufacturing and field operation. These concerns significantly inhibit design flexibility. For example, semiconductor chip sizes may be limited or interconnect sizes, shapes and spacing may have to be customized outside or beyond industry standards to reduce these stresses. These limitations may limit the electrical performance advantages of the electronic package and/or add significant cost to the electronic package.

A particular yield and reliability concern is that of the surface redistribution layer, which electrically interfaces between the chip carrier and the printed circuit board, and the solder mask layer positioned on the redistribution layer. These layers may be susceptible to stresses transmitted from the printed circuit through the BGA solder ball interconnections from handling or thermal cycling of the electronic package. If the redistribution layer and solder mask layer cannot accommodate the stresses, then they are susceptible to deterioration, such as cracking, which can cause failure of the electronic package. High stresses transmitted to these layers will occur at the edges of the BGA interconnection pads and will be highest at the edges of the BGA interconnection pads under the rows of BGA solder ball interconnections at or near a corner of the chip carrier. To a lesser extent, high stresses transmitted to these layers can occur at the edges of the BGA interconnection pads under the rows of BGA solder ball interconnections at or near the non corner edges of the chip carrier. Cracks in the solder mask and redistribution layer caused by the flexure, described above, generally initiate in these areas of highest stress. Solutions to this problem which limit or reduce the amount of printed circuit board flexure can be impractical and overly restrictive.

FIG. 1A shows a much enlarged bottom view of a portion of a prior art chip carrier 10. FIG. 1B shows a much enlarged view, in elevation of the portion of prior art chip carrier 10, taken along line 1B—1B in FIG. 1A. The chip carrier 10 includes a circuitized substrate 12 having a first surface 14 and a first circuit pattern 16 on the first surface. First circuit pattern 16 can also be referred to as a redistribution layer. An insulating layer 18 is on first surface 14 of circuitized substrate 12 and on first circuit pattern 16. Insulating layer 18 includes an upper surface 20. A second circuit pattern 22 is electrically connected to first circuit pattern 16 by a conductive aperture 24 and is on upper surface 20 of first insulating layer 18 so as to only partially cover first circuit pattern 16. An electrical element 26, for example a solder ball, is on second circuit pattern 22, and makes electrical contact with the second circuit pattern. A portion of a printed circuit board 28, shown in phantom, is electrically coupled to electrical element 26. As described above, flexure or bending of printed circuit board 28 can lead to stresses imparted into electrical element 26. A high stress will occur at the edge p1 of second circuit pattern 22. When electrical element 26 is one of an array (not shown) of solder ball interconnections, the highest stresses will occur at the corner regions, and to a lesser extent at the non corner edge regions, of the array of solder ball interconnections at the edge p1 of second circuit pattern 22. As a result of these high stresses, a crack p3 can develop in insulating layer 18. Stress can then be concentrated on first circuit pattern 16 eventually resulting in a crack p4 in the first circuit pattern, creating an electrical open. Yield and reliability of the chip carrier and the electronic package of which it is a part can be negatively affected.

Thus it is desirable to have a flexible chip carrier that substantially inhibits or prevents cracking of the first circuit pattern during flexure of the chip carrier caused by assembly, handling or operation. Chip carriers of this type will have improved yield and increased operational field life.

OBJECTS AND SUMMARY OF THE INVENTION

Accordingly, it is the object of this invention to enhance the art of packaging technology.

It is another object of this invention to provide a flexible chip carrier that provides an improved circuit pattern design on a circuitized substrate of the chip carrier.

It is yet another object of the invention to provide a flexible chip carrier that includes a circuitized substrate that will be manufactured in such a manner that substantially inhibits or prevents cracking of a circuit pattern positioned on a surface of the circuitized substrate, has increased yields and can be produced at a relatively lower costs than many current products.

It is still yet another object of the invention to provide a flexible chip carrier that substantially inhibits or prevents cracking of the circuit pattern during operation of the electronic package that results in having much improved operational field life.

According to one aspect of the invention, there is provided a flexible chip carrier comprising a circuitized substrate having a corner surface region, a conductor on the corner surface region and an insulating layer on the corner surface region of the substrate and on the conductor. A solder pad is on a surface of the insulating layer opposite the conductor, the solder pad being electrically connected to the conductor through an opening in the insulating layer and substantially overlaying the conductor such that if the chip carrier is flexed, cracking of the conductor is inhibited.

The above objects, advantages, and features of the present invention will become more readily apparent from the following detailed description of the presently preferred embodiments as illustrated in the accompanying drawings.

BEST MODE FOR CARRYING OUT THE INVENTION

Figure 1A:
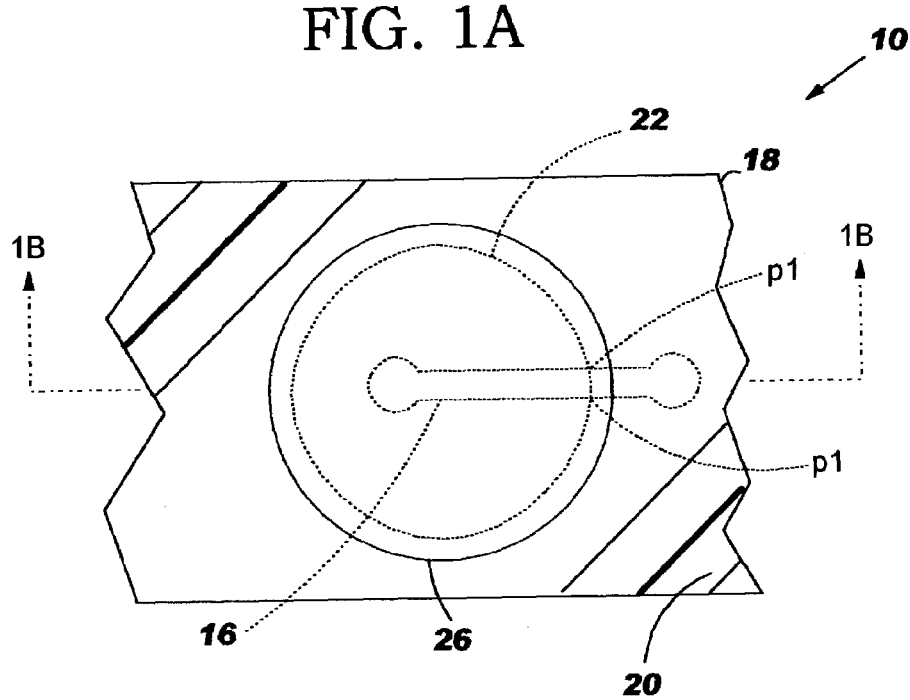
FIG. 1A illustrates a much enlarged bottom view of a portion of a prior art chip carrier.
Figure 1B:
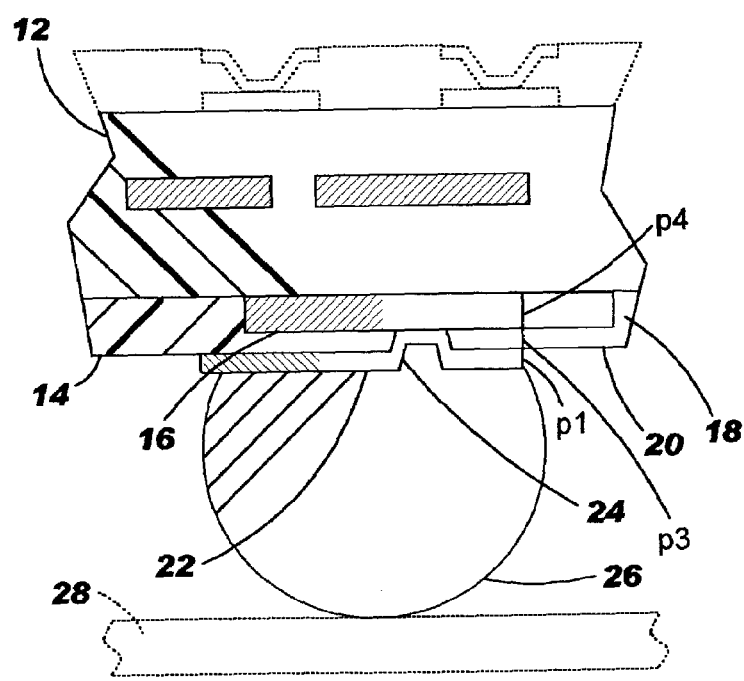
FIG. 1B illustrates a much enlarged view, in elevation, of the portion of the prior art chip carrier of FIG. 1A, taken along line 1B—1B in FIG. 1A.
Figure 2A:
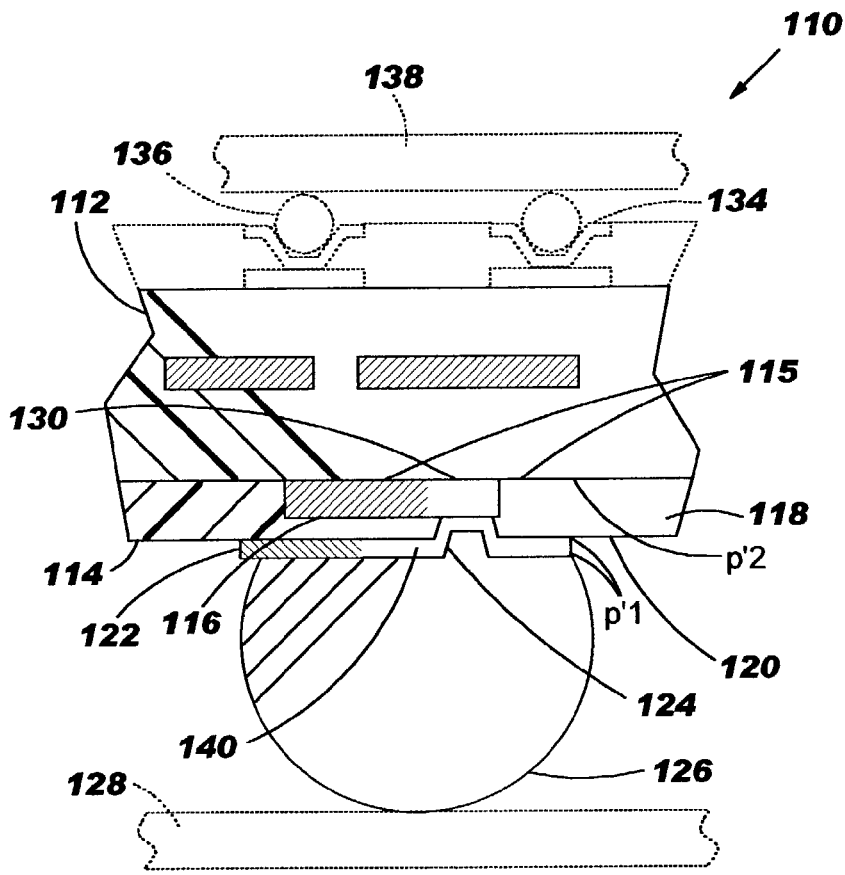
FIG. 2A illustrates a much enlarged view, in elevation, of one embodiment of a portion the chip carrier of the present invention taken along line 2B—2B in FIG. 2B.
Figure 2B:
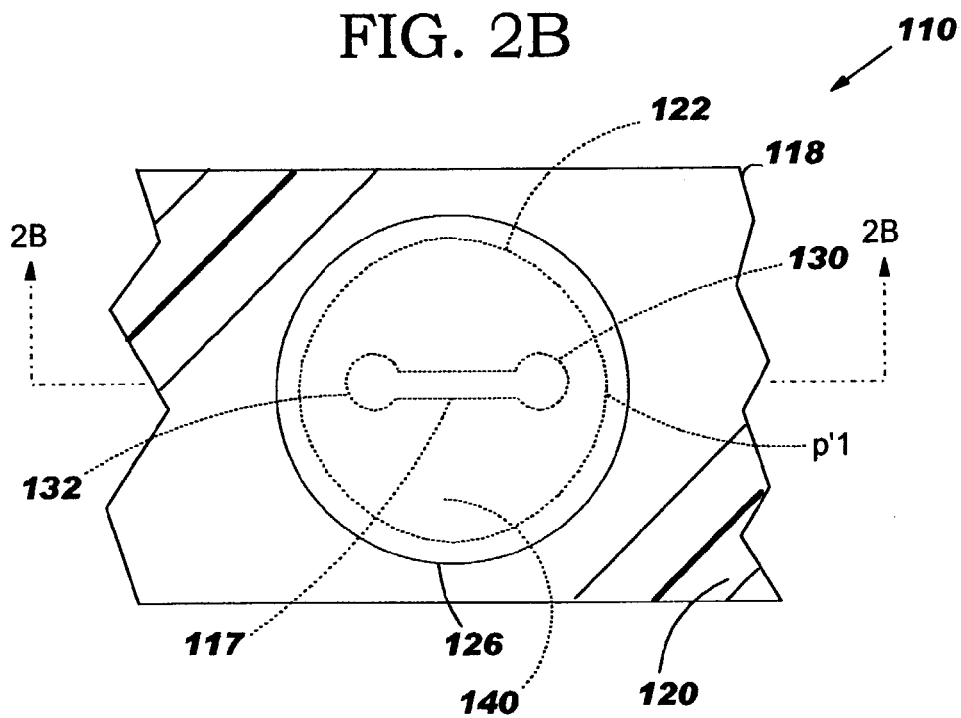
FIG. 2B illustrates a much enlarged bottom view of the portion of the chip carrier of FIG. 2A.

A portion of electronic package 110, for example a chip carrier, illustrating one embodiment of the present invention is shown in FIG. 2A. FIG. 2A shows a much enlarged view, in elevation, of a portion of electronic package 110 taken along line 2B—2B in FIG. 2B. FIG. 2B shows a bottom view of the portion of electronic package 110 shown in FIG. 2A. Referring to FIG. 2A, electronic package 110 includes a circuitized substrate 112 which includes a first surface 114 and a surface region 115. Surface region 115 is at a corner or a non corner edge of circuitized substrate 110. The corner surface region and non corner surface edge region will be described in greater detail below. First surface 114 has a first circuit pattern 116 thereon. An insulating layer 118 is on surface region 115 of circuitized substrate 112 and on at least a part of first circuit pattern 116. The insulating layer 118 includes an upper surface 120. A second circuit pattern 122 is electrically connected to first circuit pattern 116 by a conductive aperture 124 and is on upper surface 120 of first insulating layer 118 in such a manner so as to substantially inhibit or prevent cracking of first circuit pattern 116 during operation of electronic package 110. Insulating layer 118 can be a solder mask or any dielectric layer that can be laminated, coated, or applied in some other manner. Examples of commercially available solder masks that can be used in this invention are PSR-4000 (PSR-4000 is a registered trademark of Taiyo America Inc., 2675 Antler Drive, Carson City, Nev.) or PC5103, an allylated polyphenylene ether (APPE), manufactured by Asahi Chemical Company of Japan. Operation of electronic package 110 can be defined as burn-in, field usage, and/or handling operations that can occur during manufacture of the electronic package, including but not limited to, handling through assembly and use of pressure-probes for electrical testing. First circuit pattern 116 can comprise at least one conductor having a predetermined configuration. In FIG. 2B the conductor of first circuit pattern 116 is illustrated as a dogbone shaped conductor 117 and is useful for electrically connecting the bottom wall 130 of aperture 124 with an end 132 of a conductive through hole (not shown) in circuitized substrate 112. Dogbone shaped conductor 117 redistributes signals or power to and from electronic package 110 and is referred to as a redistribution layer. Other configurations for the redistribution layer can be used depending on the function of circuitized substrate 112.

In FIG. 2A, circuitized substrate 112 is shown as a chip carrier and includes chip connections 134 (shown in phantom) adapted to make electrical connection with the conductive solder balls 136 of a flip chip 138 (both shown in phantom). Second circuit pattern 122 comprises at least one conductive member 140, for example, an annular pad, which is oriented over dogbone shaped conductor 117 so as to fully cover the conductor. The at least one conductive member 140 can be one of a plurality of BGA pads, selected ones of which include an electrical element, such as solder ball 126, positioned thereon. Conductive member 140 is electrically connected to solder ball 126 which is coupled to a printed circuit board 128 (shown in phantom). Other electrical elements, such as solder columns, can be used in this invention.

As described above, high stresses that are transmitted during flexure of printed circuit board 128 and transmitted to solder ball 126 and into annular pad 140 are concentrated at the edge p'1 of the conductive member of the annular pad. If desired, the pad can have other shapes. One such shape is elliptical. Importantly, since annular pad 140 fully covers dogbone shaped conductor 117, stress concentrated at edge p'1 is transmitted into first insulating layer 118 and distributed onto first surface 114 of circuitized substrate 112 in an area p'2 under and proximate edge p'1. Significantly there is little opportunity for the stress transmitted onto first surface 114 of circuitized substrate 112 to crack dogbone shaped conductor 117 because no part of the dogbone shaped conductor lies directly beneath the high stress edge p'1. This design effectively inhibits and prevents stress related dogbone shaped conductor cracking by protecting it with the annular pad 116 of circuitized substrate 112 positioned above it. Generally, solid planes are the next layer below layer 116 and are much less susceptible to failure due to localized cracking.

Figure 3:
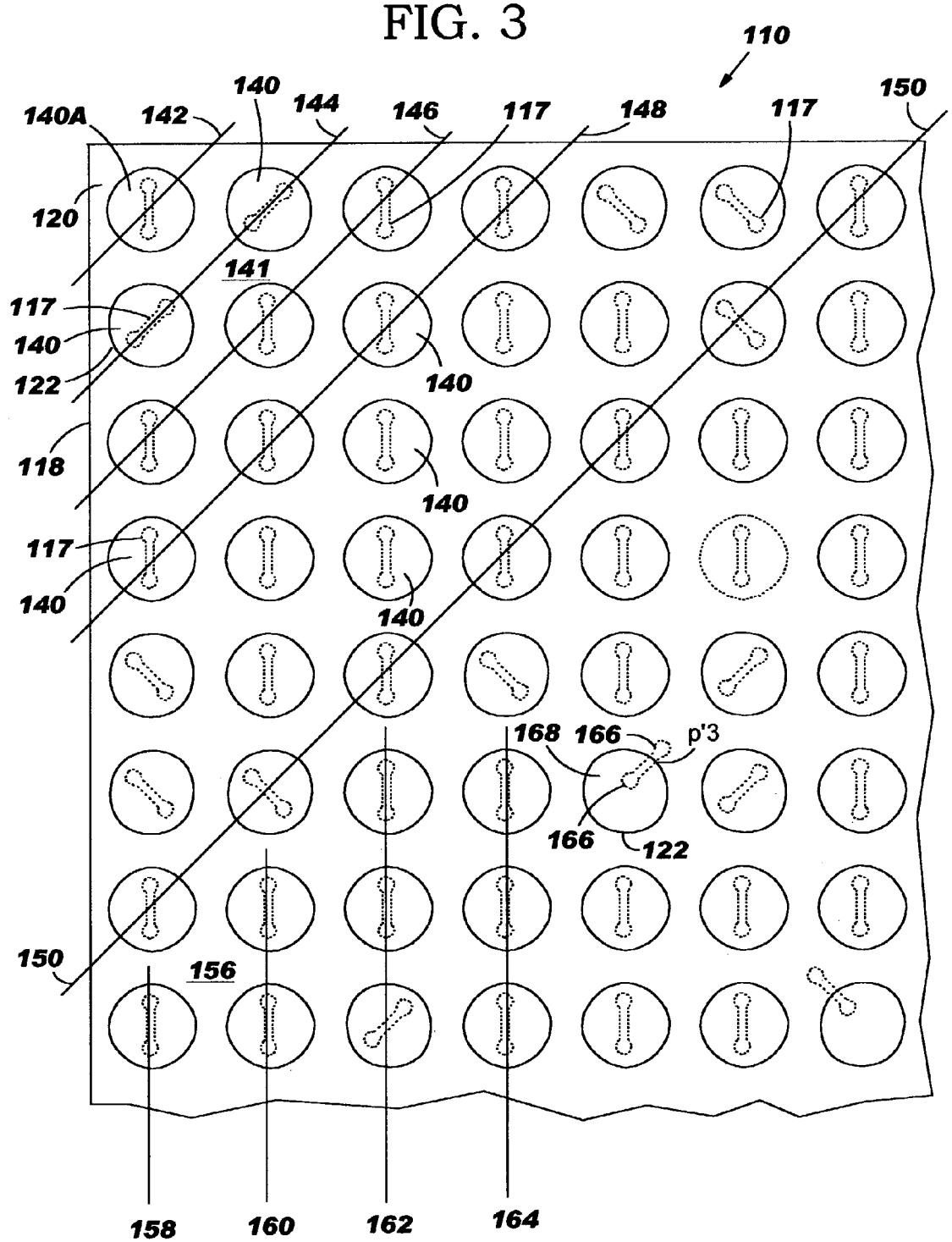
FIG. 3 illustrates a much enlarged bottom view of a corner surface region, a non corner surface edge region, and a surface region adjacent to the corner and non corner surface edge regions of the chip carrier of the present invention.

FIG. 3 illustrates a much enlarged bottom plan view of a portion of electronic package 110. A corner surface region 141 of electronic package 110 includes a plurality of annular pads 140 that intersect at least lines 142, 144, 146, and 148. The plurality of annular pads 140 are shown fully covering dogbone shaped conductors 117 on corner surface region 141. Conductors that intersect each line 142–148 are defined as string portions. For example, conductor 140A intersects line 142 and is defined as the first string portion 142. Conductors that intersect line 148 are defined as the fourth string portion 148. A corner surface region can include all annular pads 140 in seven string portions beginning with first string portion 142 up to and including a seventh string portion 150. Electronic package 110 includes at least four corner surface regions. Electronic package 110 can include at least one non corner surface edge region 156. Region 156 includes a plurality of annular pads 140 that intersect edge string portions 158–164. For example conductor 140B intersects line 158 and is defined as the first edge string portion 158. Conductors that intersect line 164 are defined as the fourth edge string portion. A non corner surface edge region can include all circular pads 140 in at least 4 edge string portions beginning with the first edge string portion 158, up to and including the fourth edge string portion 164. As described above, the highest stresses that are transmitted during operational flexure of printed circuit board 128 occur at the edges of annular pads 140 on the corner regions of electronic package 110 and to a lesser extent on the non corner edge regions of electronic package 110. Importantly, all seven string portions between string portions 142 and 150 on corner region 141 of electronic package 110 and all four edge string portions 158–164 on non corner surface edge region 156 of electronic package 110, include only annular pads 140 which fully cover dogbone shaped conductors 117. Electronic package 110 comprises at least one other conductor 166 of first circuit pattern 116, having a predetermined configuration, for example a dogbone shape, adjacent four corner surface region 141 and non corner surface edge region 156. At least one other conductor member 168 of second circuit pattern 122 includes a predetermined configuration, for example an annular shape, oriented over other conductor 166 so as to only partially cover the other conductor. The portion of electronic package 110 positioned outside corner surface region 141, or non corner surface edge region 156, can include any combination of conductors 117 or 166 of the first conductive pattern, depending on electrical wiring required, with conductors 117 or 166 fully covered or partially covered by conductive members 140 or 168 of the second conductive pattern, respectively. This mixed design is allowed because the stress on edge p'3 of second conductor 168, positioned away from corner surface region 141 and non corner surface edge region 156, even though high, is not high enough to crack conductor 168 during flexing because it is not compounded by the additional stress associated with being positioned on a corner region or a non corner edge region of the circuitized substrate.

What has been shown and described are at present considered the preferred embodiments of this invention, it will be obvious to those skilled in the art that various changes and modifications can be made therein without departing from the scope of the invention as defined by the appended claims.

We claim:

1. A flexible chip carrier for use in an electronic package including a chip mounted to a first substrate having a first plurality of conductive solder balls positioned along a surface thereof and defining a first grid area, wherein said first plurality of solder balls are interconnected by a first redistribution circuitry layer to said chip, said chip carrier comprising:
   a second substrate having upper and lower opposing surfaces and a corner surface region;
   a plurality of chip connections formed along said upper surface of said second substrate for engaging said first plurality of conductive solder balls;
   a second plurality of solder balls positioned along said lower surface of said second substrate and defining a second grid area, wherein said second grid area is larger than said first grid area;
   a second redistribution circuitry layer electrically interconnecting said plurality of chip connections to said second plurality of solder balls;
   a conductor on said corner surface region;
   an insulating layer on said corner surface region of said second substrate and on said conductor; and
   a solder pad on a surface of said insulating layer opposite said conductor, said solder pad being electrically connected to said conductor through an opening in said insulating layer and substantially overlaying said conductor such that if said chip carrier is flexed, cracking of said conductor is inhibited.

2. The flexible chip carrier of claim 1, wherein said second substrate includes four corner surface regions.

3. The flexible chip carrier of claim 2, wherein said solder pad has a predetermined configuration and is oriented over said conductor so as to substantially fully cover said conductor.

4. The flexible chip carrier of claim 3, wherein said conductor comprises one of a plurality of said conductors arranged in at least four concentric string portions.

5. The flexible chip carrier of claim 4, wherein selected ones of said plurality of conductors include a dogbone shape.

6. The flexible chip carrier of claim 5, wherein said solder pad comprises one of a plurality of said solder pads arranged in at least four concentric string portions.

7. The flexible chip carrier of claim 6, wherein each of said plurality of said solder pads includes a substantially annular shape.

8. The flexible chip carrier of claim 3, wherein said solder pad comprises a ball grid array pad.

9. The flexible chip carrier of claim 3, wherein at least one other conductor having a predetermined configuration is positioned adjacent to at least one of said four corner surface regions, said solder pad comprising at least one other solder pad having a predetermined configuration oriented over said at least one other conductor so as to only partially cover said at least one other conductor.

10. The flexible chip carrier of claim 2, wherein said corner surface region is a non corner surface edge region.

11. The flexible chip carrier of claim 10, wherein said solder pad has a predetermined configuration and is oriented over said conductor so as to substantially fully cover said conductor.

12. The flexible chip carrier of claim 11, wherein said conductor comprises one of a plurality of said conductors arranged in at least four concentric string portions.

13. The flexible chip carrier of claim 12, wherein selected ones of said plurality of conductors include a dogbone shape.

14. The flexible chip carrier of claim 13, wherein said solder pad comprises one of a plurality of said solder pads arranged in at least four concentric string portions.

15. The flexible chip carrier of claim 14, wherein each of said plurality of said solder pads includes a substantially annular shape.

16. The flexible chip carrier of claim 11, wherein said solder pad comprises a ball grid array pad.

17. The flexible chip carrier of claim 11, wherein at least one other conductor having a predetermined configuration is positioned adjacent to at least one of said four non corner edge surface regions, said solder pad comprising at least one other solder pad having a predetermined configuration oriented over said at least one other conductor so as to only partially cover said at least one other conductor.

18. The flexible chip carrier of claim 10, wherein said insulating layer comprises a solder mask.

19. The flexible chip carrier of claim 10, wherein said solder pad includes an electrical element positioned thereon.

20. The flexible chip carrier of claim 19, wherein said electrical element comprises a solder ball.

21. The flexible chip carrier of claim 20, wherein said solder ball is electrically connected to a circuitized substrate.

22. The flexible chip carrier of claim 1, wherein said insulating layer comprises a solder mask.

23. The flexible chip carrier of claim 1, wherein said solder pad includes an electrical element positioned thereon.

24. The flexible chip carrier of claim 23, wherein said electrical element comprises a solder ball.

25. The flexible chip carrier of claim 24, wherein said solder ball is electrically connected to a circuitized substrate.

* * * * *